(12) United States Patent
Sin et al.

(10) Patent No.: US 6,418,048 B1
(45) Date of Patent: Jul. 9, 2002

(54) SPIN-DEPENDENT TUNNELING SENSOR SUITABLE FOR A MAGNETIC MEMORY

(75) Inventors: Kyusik Sin; Shin Funada, both of Pleasanton; Hugh C. Hiner; Xizeng Shi, both of Fremont, all of CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/969,315

(22) Filed: Oct. 2, 2001

Related U.S. Application Data

(60) Provisional application No. 60/312,598, filed on Aug. 15, 2001.

(51) Int. Cl.[7] .................................................. G11C 11/15
(52) U.S. Cl. ........................ 365/173; 365/171; 365/158
(58) Field of Search ................................. 365/158, 173, 365/171

(56) References Cited

U.S. PATENT DOCUMENTS

| | | | | |
|---|---|---|---|---|
| 5,650,958 A | * | 7/1997 | Gallagher et al. | 365/173 |
| 5,764,567 A | * | 6/1998 | Parkin | 365/173 |
| 5,792,510 A | * | 8/1998 | Farrow et al. | 427/130 |
| 5,871,622 A | * | 2/1999 | Pinarbasi | 204/192.11 |
| 6,297,983 B1 | * | 10/2001 | Bhattacharyya | 365/55 |

* cited by examiner

*Primary Examiner*—Andrew Q. Tran
(74) *Attorney, Agent, or Firm*—Sawyer Law Group LLP

(57) ABSTRACT

A method and system for providing a top pinned spin-dependent tunneling sensor is disclosed. The method and system include providing a free layer, a tunneling barrier, a synthetic pinned layer and an antiferromagnetic layer. The free layer is ferromagnetic. The tunneling barrier is an insulator. The tunneling barrier is disposed between the free layer and the synthetic pinned layer. The synthetic pinned layer is ferromagnetic and includes a ferromagnetic top layer. The synthetic pinned layer is between the tunneling barrier and the antiferromagnetic layer. The ferromagnetic top layer acts as a seed layer for the antiferromagnetic layer.

15 Claims, 4 Drawing Sheets

SPIN-DEPENDENT TUNNELING SENSOR SUITABLE FOR A MAGNETIC MEMORY

CROSS-REFERENCE TO RELATED APPLICATION

This application is claiming under 35 USC 119(e) the benefit of provisional patent Application No. 60/312,598 filed on Aug. 15, 2001.

FIELD OF THE INVENTION

The present invention relates to magnetic systems, and more particularly to a method and system for providing spin-dependent tunneling sensors suitable for use as cells in a magnetic memory.

BACKGROUND OF THE INVENTION

Because of their high magnetoresistance ratio, spin dependent tunneling sensors are currently of interest for use in a variety of devices, including magnetic memories such as magnetic random access memories (MRAM). FIG. 1 depicts a conventional bottom spin-dependent tunneling sensor 10. The conventional spin-dependent tunneling sensor 10 includes a seed layer 12, an antiferromagnetic layer 14, a pinned layer 16, a tunneling barrier 18, a free layer 20 and a capping layer 22. The pinned layer 16 and the free layer 20 are ferromagnetic. The antiferromagnetic layer 14 fixes, or pins, the magnetization of the pinned layer 16 in a particular direction. The magnetization of the free layer 20 is free to rotate in response to a writing field provided at the conventional spin-dependent tunneling sensor 10. The tunneling barrier 18 is an insulator such as alumina and is thin enough to allow charge carriers to tunnel between the free layer 20 and the pinned layer 16. Based on the orientation of the magnetizations of the free layer 20 and the pinned layer 16, the resistance and thus the current through the conventional spin-dependent tunneling sensor 10 changes.

FIG. 2 depicts another conventional spin-dependent tunneling sensor 30. The conventional spin-dependent tunneling sensor 30 includes a seed layer 32, an antiferromagnetic layer 34, a conventional synthetic pinned layer 36, a tunneling barrier 44, a free layer 46 and a capping layer 48. The conventional synthetic pinned layer 36 includes two ferromagnetic layers 38 and 42 separated by a nonmagnetic spacer layer 40. The conventional spin-dependent tunneling sensor 30 functions similarly to the conventional spin-dependent tunneling sensor depicted in FIG. 1.

Although the conventional spin-dependent tunneling sensors 10 and 30 function, one of ordinary skill in the art will readily recognize that the conventional spin-dependent tunneling sensors 10 and 30 do not have a symmetric response to an external magnetic field. FIG. 3 depicts a hysteresis loop 50 of the conventional spin-dependent tunneling sensor 10 or 30. The hysteresis loop 50 indicates the magnetization of the conventional spin-dependent tunneling sensor 10 or 30 versus external field applied to the conventional spin-dependent tunneling sensor 10 or 30. The hysteresis loop 50 is shifted from being symmetric about a zero external field. This occurs because of an interlayer coupling (known as orange peel coupling) between the free layers 20 and 46 and the pinned layers 16 and 36, respectively. The tunneling barriers 18 and 44 have a relatively rough upper surface because they have an antiferromagnetic layer 14 beneath them. Thus, the free layers 20 and 46 also have rough surfaces. The rough interfaces of the free layers 20 and 46 and the conventional pinned layers 16 and 36 result in a high interlayer coupling. The conventional spin-dependent tunneling sensors 10 and 30 thus behave as though there is an additional field applied to the free layers 20 and 46. The response of the conventional spin-dependent tunneling sensors 10 and 30 are thus shifted from being symmetric about a zero external field. Because the magnetization of the conventional spin-dependent tunneling sensors 10 and 30 are asymmetric with respect to an external applied field, the magnetoresistance of the conventional spin-dependent tunneling sensors 10 and 30 is also asymmetric.

FIG. 4 depicts a conventional top pinned spin-dependent tunneling sensor 60. The asymmetry of the conventional spin-dependent tunneling sensors 10 and 30 can be addressed using a conventional top pinned spin-dependent tunneling sensor 60. The conventional top pinned spin-dependent tunneling sensor 60 includes a seed layer 62, a free layer 64, a tunneling barrier 66, a conventional synthetic pinned layer 68, an antiferromagnetic layer 76 and a capping layer 78. The conventional synthetic pinned layer includes two ferromagnetic layers 70 and 74 separated by a thin, nonmagnetic spacer layer 72. The free layer 64 and conventional synthetic pinned layer 68 operate in a manner that is analogous to the conventional spin-dependent tunneling sensors 10 and 30.

Because the free layer 64 is not formed on the thick layer including a tunneling barrier, a pinned layer and an antiferromagnetic layer, the conventional spin-dependent tunneling device 60 is not subject to a high interlayer coupling. However, the conventional spin-dependent tunneling device 60 has a poorly pinned conventional synthetic pinned layer 68. The conventional synthetic pinned layer 68 and the antiferromagnetic layer 76 are grown above the tunneling barrier 66, which is amorphous. As a result, the antiferromagnetic layer 76 may be of poor quality. Consequently, the exchange coupling between the antiferromagnetic layer 76 and the conventional synthetic pinned layer 68 is reduced. As a result, the magnetization of the conventional synthetic pinned layer 68 is poorly pinned and may move in response to a writing field. Thus, the signal from the conventional spin-dependent tunneling device 60 may be unreliable.

Accordingly, what is needed is a system and method for providing an improved spin-dependent tunneling sensor. The present invention addresses such a need.

SUMMARY OF THE INVENTION

The present invention provides a method and system for providing a top pinned spin-dependent tunneling sensor. The method and system comprise providing a free layer, a tunneling barrier, a synthetic pinned layer and an antiferromagnetic layer. The free layer is ferromagnetic. The tunneling barrier is an insulator. The tunneling barrier is disposed between the free layer and the synthetic pinned layer. The synthetic pinned layer is ferromagnetic and includes a ferromagnetic top layer. The synthetic pinned layer is between the tunneling barrier and the antiferromagnetic layer. The ferromagnetic top layer acts as a seed layer for the antiferromagnetic layer.

According to the system and method disclosed herein, the present invention provides a top pinned spin-dependent tunneling sensor that has improved pinning, between the synthetic pinned layer and the antiferromagnetic layer.

DETAILED DESCRIPTION OF THE INVENTION

The present invention relates to an improvement in spin dependent tunneling sensors. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a top pinned spin-dependent tunneling sensor. The method and system comprise providing a free layer, a tunneling barrier, a synthetic pinned layer and an antiferromagnetic layer. The free layer is ferromagnetic. The tunneling barrier is an insulator. The tunneling barrier is disposed between the free layer and the synthetic pinned layer. The synthetic pinned layer is ferromagnetic and includes a ferromagnetic top layer. The synthetic pinned layer is between the tunneling barrier and the antiferromagnetic layer. The ferromagnetic top layer acts as a seed layer for the antiferromagnetic layer.

The present invention will be described in terms of a particular spin-dependent tunneling sensor using particular materials. However, one of ordinary skill in the art will readily recognize that this method and system will operate effectively for other spin-dependent tunneling sensors using other materials that are consistent with the present invention. The present invention is also described in the context of a particular magnetic memory. However, one of ordinary skill in the art will readily realize that the present invention is consistent with other memories utilizing spin-dependent tunneling sensors for storing data.

Figure 5:
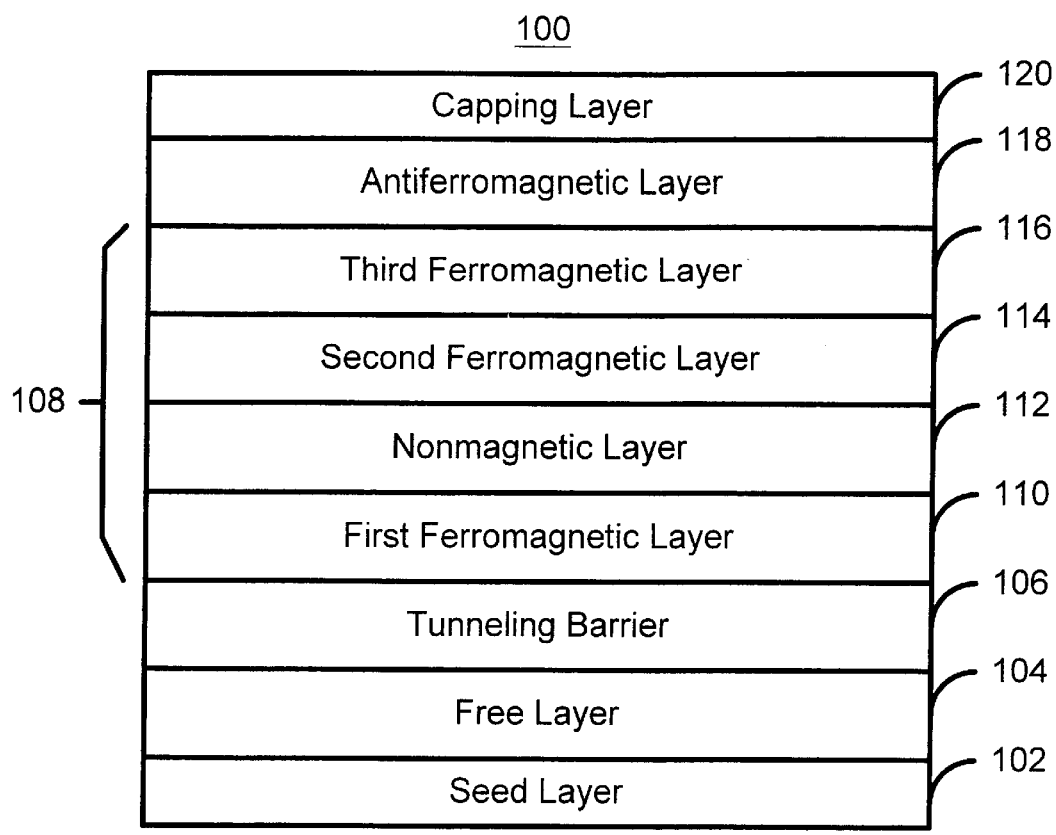
FIG. 5 is a diagram of a spin dependent tunneling sensor in accordance with the present invention having a top synthetic pinned layer.

To more particularly illustrate the method and system in accordance with the present invention, refer now to FIG. 5, depicting one embodiment of a spin-dependent tunneling sensor 100 in accordance with the present invention. The spin-dependent tunneling sensor 100 includes a free layer 104, a tunneling barrier 106, a synthetic pinned layer 108, and an antiferromagnetic layer 118. The spin-dependent tunneling sensor 100 also preferably includes a seed layer 102 on which the free layer 104 is deposited and a capping layer 120 on the antiferromagnetic layer 118. The free layer 104 and the synthetic pinned layer 108 are ferromagnetic. The free layer 104 is preferably CoFe, Co, Fe, NiFe, or CoNiFe and is preferably between ten and one hundred Angstroms thick. The tunneling barrier 106 is an insulator and is thin enough to allow charge carriers to tunnel between the synthetic pinned layer 108 and the free layer 104. The tunneling barrier 106 is preferably made of alumina and is between five and twenty Angstroms in thickness. The antiferromagnetic layer 118 is preferably between one hundred twenty and three hundred fifty Angstroms and is preferably PtMn. Examples of other antiferromagnets that can be used are NiMn, IrMn and PtPdMn.

The synthetic pinned layer 108 is ferromagnetic and is composed of three ferromagnetic layers and one nonmagnetic layer. The first magnetic layer 110 and the second magnetic layer 114 are preferably CoFe. The first magnetic layer 110 and the second magnetic layer 114 are each preferably between ten and thirty Angstroms thick. The nomnagnetic layer 112 is conductive and is preferably Ru that is between six and nine Angstroms thick. The synthetic pinned layer 108 also includes a third ferromagnetic layer 16. The third ferromagnetic layer 116 is ferromagnetically coupled to the second ferromagnetic layer 114. The third ferromagnetic layer 116 acts as a seed layer for the antiferromagnetic layer 118. Thus, the third ferromagnetic layer 116 preferably has a crystal structure that is close to that of the antiferromagnet used in the antiferromagnetic layer 118. In a preferred embodiment, the third ferromagnetic layer 116 is $Ni_{81}Fe_{19}$. The third ferromagnetic layer could also be $Ni_xFe_{1-x}$, where x is preferably between 10 and 30. The third ferromagnetic layer 116 is magnetically coupled to the antiferromagnetic layer 118. Thus, the antiferromagnetic layer 118 can pin the synthetic pinned layer 108 through the third ferromagnetic layer 116.

Figure 6:
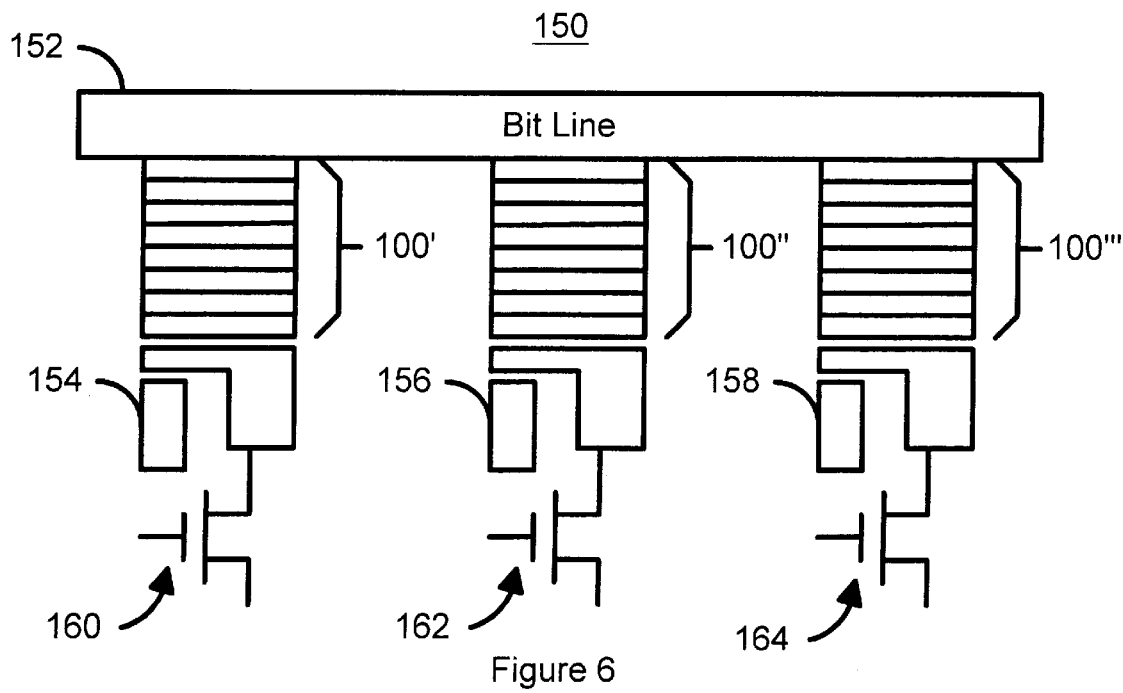
FIG. 6 is a diagram of a magnetic memory utilizing spin dependent tunneling sensors in accordance with the present invention having top synthetic pinned layers.

FIG. 6 is a diagram of a magnetic memory 150 utilizing spin-dependent tunneling sensors 100 in accordance with the present invention. The magnetic memory 150 includes spin-dependent tunneling sensors 100', 100" and 100"' as the memory cells. The magnetic memory 150 also includes bit line 152 and word lines 154, 156 and 158. Although only one bit line 152 for a single row of cells is shown, the magnetic memory 150 typically includes multiple bit lines for multiple rows of cells. Each word line 154, 156 and 158 is coupled with a transistor 160, 162 and 164, respectively. The transistors 160, 162 and 164 are used to read the state of the cells spin-dependent tunneling sensors 100', 100" and 100"'. The spin-dependent tunneling sensors 100', 100" and 100"' are preferably the same as the spin-dependent tunneling sensor 100 depicted in FIG. 5.

Referring to FIGS. 5 and 6, in order to write to the magnetic memory 150, current is applied to the bit line 152 and one of the word lines 154, 156 and 158. For example, suppose the spin-dependent tunneling sensor 100' is to be written. The current through the lines 152 and 154 generates a magnetic field at the spin-dependent tunneling sensor 100' that is large enough to align the magnetization of the free layer 104 in a particular direction. Depending on the direction with which the free layer 104 is aligned, the spin-dependent tunneling sensor 100' has a lower or a higher resistance. In order to read the magnetic memory 150, the magnitude of the current through or voltage across the transistor 160, 162 or 164 is determined. The magnitude of the current depends upon the resistance of the spin-dependent tunneling sensor 100', 100" or 100"'.

Figure 1:
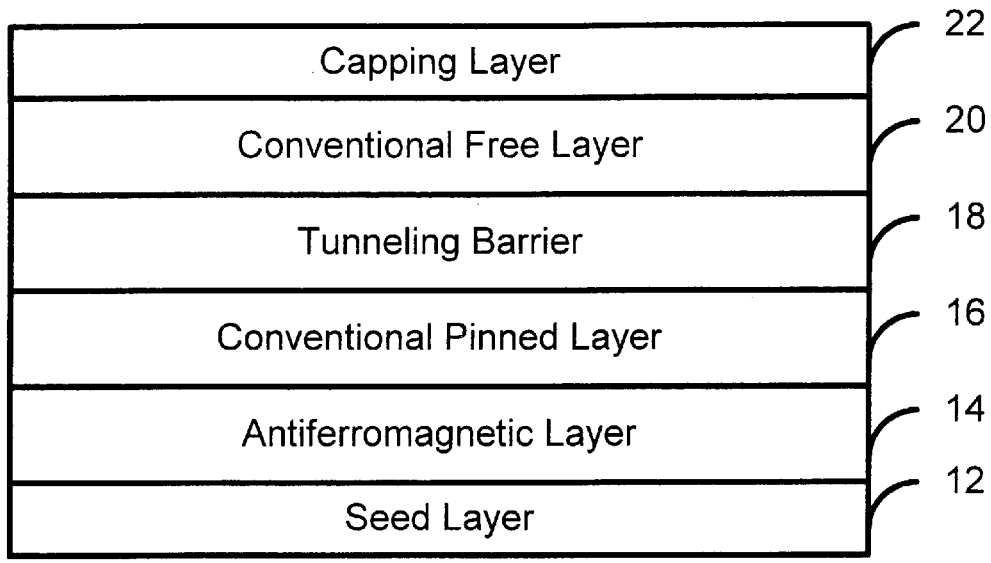
FIG. 1 is a diagram of a conventional spin dependent tunneling sensor having a bottom pinned layer.
Figure 2:
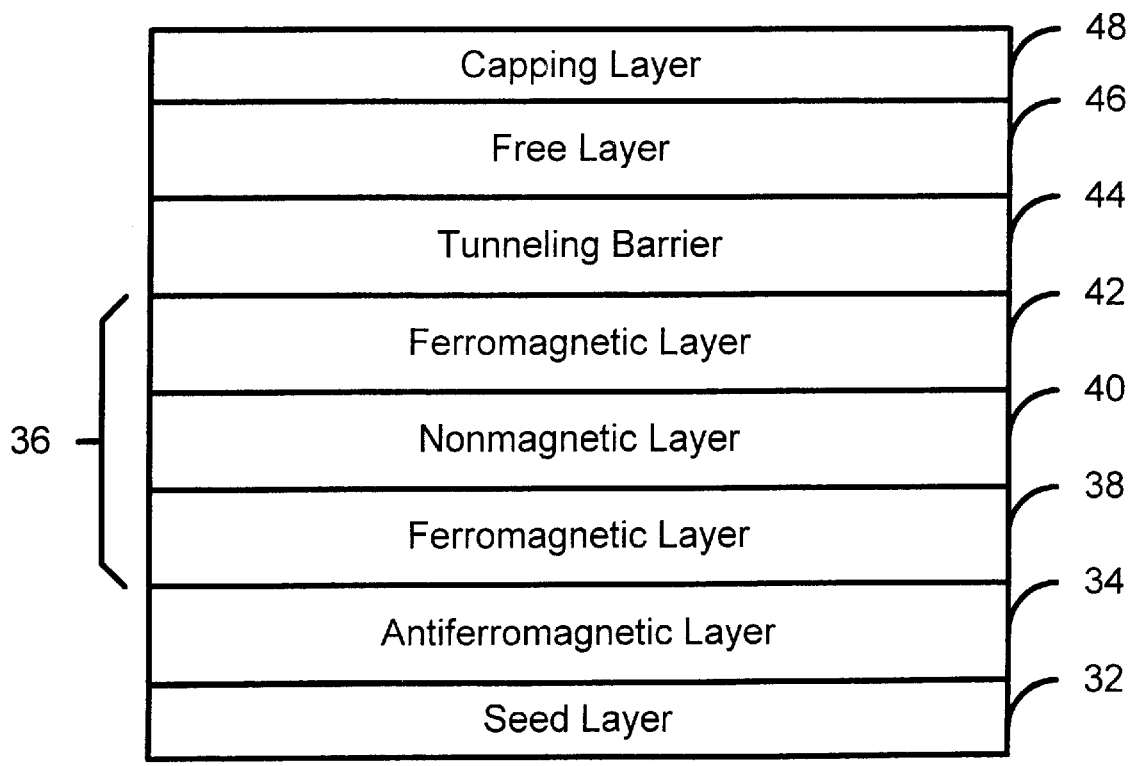
FIG. 2 is a diagram of a conventional spin dependent tunneling sensor having a bottom synthetic pinned layer.
Figure 3:
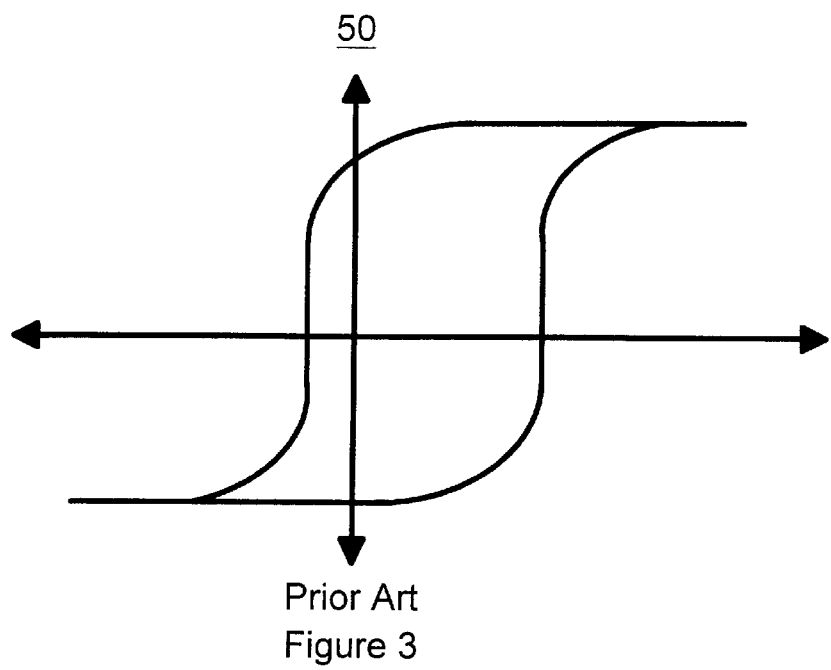
FIG. 3 is a diagram depicting the hysteresis loop for a conventional spin dependent tunneling sensor having a bottom pinned layer.
Figure 4:
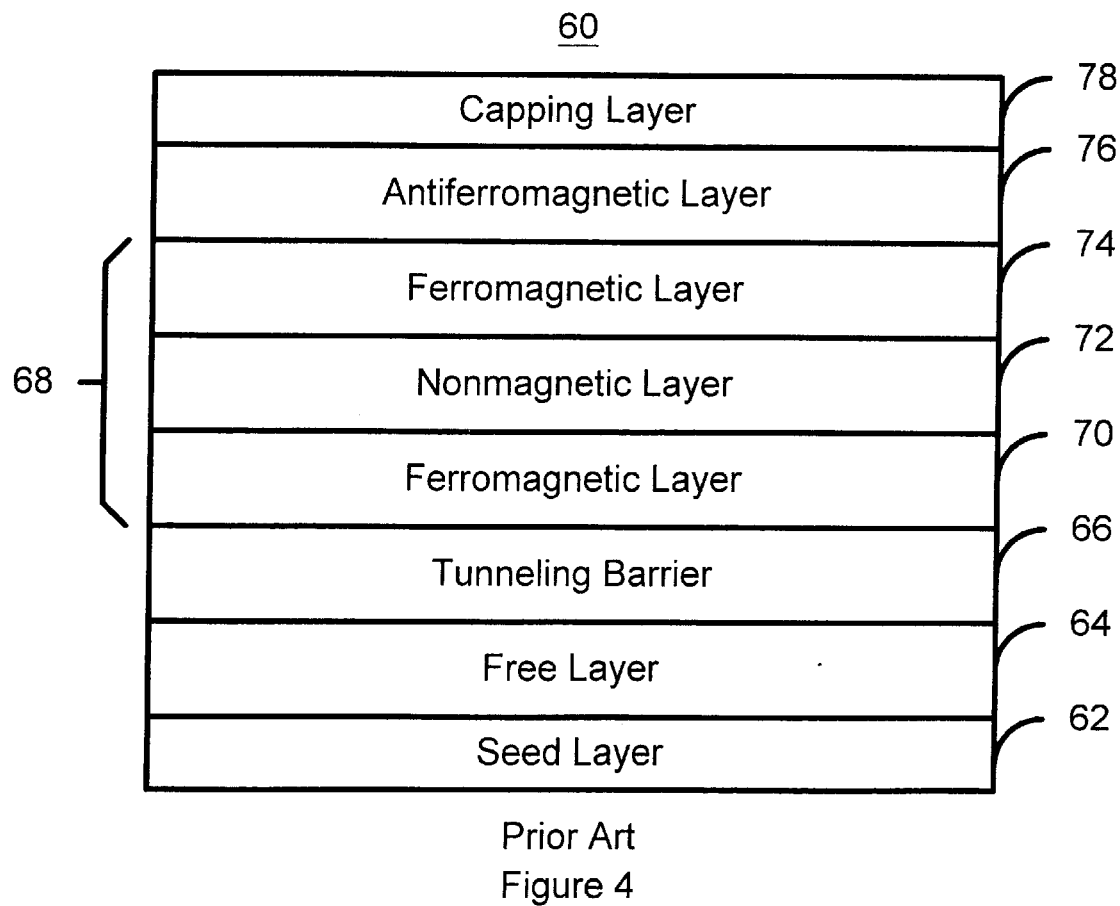
FIG. 4 is a diagram of a conventional spin dependent tunneling sensor having a top synthetic pinned layer.
Figure 7:
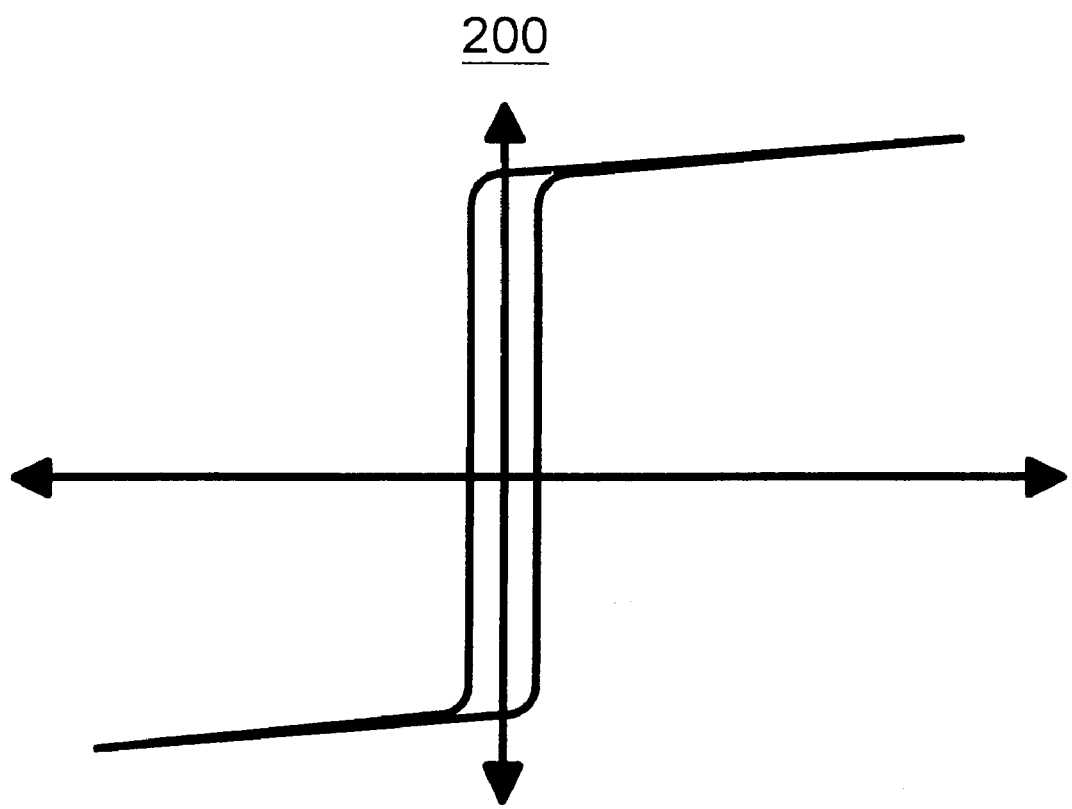
FIG. 7 is a diagram depicting the hysteresis loop for a spin dependent tunneling sensor in accordance with the present invention.

Because the third ferromagnetic layer 116 acts as a ferromagnetic seed layer, the antiferromagnet has the desired crystal structure and thus the desired magnetic properties. As a result, the exchange bias between the antiferromagnetic layer 118 and the third ferromagnetic layer 116 is improved. Thus, the magnetization of the synthetic pinned layer 108 can be pinned in the desired direction. The spin-dependent tunneling sensor 100 is thus able to function as desired. Furthermore, because the free layer 104 is deposited on a smooth surface, rather than on a thick stack including an antiferromagnetic layer, a pinned layer and a tunneling barrier, the interlayer coupling field is reduced. This is because the thicker stack of the bottom pinned structure, such as that depicted in FIG. 1, would result in a rough surface for the free layer. Consequently, the response of the spin-dependent tunneling sensor 100 is symmetric with respect to an external applied magnetic field. This can be seen in FIG. 7, which depicts a symmetric hysteresis loop 200 for the spin-dependent tunneling sensor 100. Moreover, a smaller magnetic field may be used to alter the magnetization of the free layer 104. A smaller magnetic field may thus be used to write to the cells of the magnetic memory 100. Consequently, a smaller current is driven through the bit line 152 and the word lines 154, 156 and 158. Power consumption of the magnetic memory 150 can thus be reduced. Furthermore, for similar reasons, the repeatability of switching of the spin-dependent tunneling sensors is also improved. In addition, because the tunneling barrier 106 is deposited on a smooth surface. Thus, the uniformity of the tunneling barrier 106 is improved and the number of defects in the tunneling barrier are reduced. In addition, the resistance and magnetoresistance of the spin-dependent tunneling sensor 100, 100', 100" and 100''' are more uniform across a wafer on which the spin-dependent tunneling sensors 100, 100', 100" and 100''' are formed. Consequently, the performance of the spin-dependent tunneling sensor 100, 100', 100" and 100''' and the magnetic memory 150 is improved.

A method and system has been disclosed for providing an improved spin-dependent tunneling sensor. Software written according to the present invention is to be stored in some form of computer-readable medium, such as memory, CD-ROM or transmitted over a network, and executed by a processor. Consequently, a computer-readable medium is intended to include a computer readable signal which, for example, may be transmitted over a network. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A top pinned spin-dependent tunneling sensor comprising:
   a free layer, the free layer being ferromagnetic;
   a tunneling barrier, the tunneling barrier being an insulator;
   a synthetic pinned layer, the tunneling barrier being disposed between the free layer and the synthetic pinned layer, the synthetic pinned layer being ferromagnetic and including a ferromagnetic top layer; and
   an antiferromagnetic layer, the synthetic pinned layer being between the tunneling barrier and the antiferromagnetic layer, the ferromagnetic top layer acting as a seed layer for the antiferromagnetic layer.

2. The top pinned spin dependent tunneling sensor of claim 1 wherein the ferromagnetic top layer includes $Ni_xFe_{1-x}$.

3. The top pinned spin dependent tunneling sensor of claim 2 wherein x is between 10 and 30.

4. The top pinned spin dependent tunneling sensor of claim 1 wherein the synthetic pinned layer further includes a ferromagnetic bottom layer, a nonmagnetic spacer layer and a ferromagnetic middle layer, the nonmagnetic spacer layer separating the ferromagnetic bottom layer from the ferromagnetic middle layer, the ferromagnetic top layer being on the ferromagnetic middle layer.

5. The top pinned spin dependent tunneling sensor of claim 4 wherein the ferromagnetic bottom layer is CoFe, Co, Fe, CoNiFe or NiFe, the ferromagnetic middle layer is CoFe and the nonmagnetic spacer layer is Ru.

6. A magnetic memory comprising:
   a plurality of cells, each of the plurality of cells including a top pinned spin-dependent tunneling sensor, the top pinned spin-dependent tunneling sensor including a free layer, a tunneling barrier, a synthetic pinned layer and an antiferromagnetic layer, the free layer being ferromagnetic, the tunneling barrier being an insulator, the tunneling barrier being disposed between the free layer and the synthetic pinned layer, the synthetic pinned layer being ferromagnetic and including a ferromagnetic top layer, the synthetic pinned layer being between the tunneling barrier and the antiferromagnetic layer, the ferromagnetic top layer acting as a seed layer for the antiferromagnetic layer;
   a plurality of bit lines coupled to the plurality of cells; and
   a plurality of word lines coupled to the plurality of cells, the plurality of bit lines and the plurality of word lines for selecting between the plurality of cells.

7. The magnetic memory of claim 6 wherein the ferromagnetic top layer includes $Ni_xFe_{1-x}$.

8. The magnetic memory of claim 7 wherein x is between 10 and 30.

9. The magnetic memory of claim 6 wherein the synthetic pinned layer further includes a ferromagnetic bottom layer, a nonmagnetic spacer layer and a ferromagnetic middle layer, the nonmagnetic spacer layer separating the ferromagnetic bottom layer from the ferromagnetic middle layer, the ferromagnetic top layer being on the ferromagnetic middle layer.

10. The magnetic memory of claim 9 wherein the ferromagnetic bottom layer is CoFe and the nonmagnetic spacer layer is Ru.

11. A method for providing a top pinned spin-dependent tunneling sensor comprising the steps of:
   (a) providing a free layer, the free layer being ferromagnetic;
   (b) providing a tunneling barrier on the free layer, the tunneling barrier being an insulator;
   (c) providing a synthetic pinned layer on the tunneling barrier, the synthetic pinned layer being ferromagnetic and including a ferromagnetic top layer; and
   (d) providing an antiferromagnetic layer on the synthetic pinned layer, the ferromagnetic top layer acting as a seed layer for the antiferromagnetic layer.

12. The method of claim 11 wherein the step of providing the synthetic pinned layer further includes the step of:
   (c1) providing a layer of $Ni_xFe_{1-x}$ as the ferromagnetic top layer.

13. The method of claim 12 wherein x is between 10 and 30.

14. The method of claim 11 wherein the step of providing the synthetic pinned layer (c) further includes the steps of:
   (c1) providing a ferromagnetic bottom layer;
   (c2) providing a nonmagnetic spacer layer on the ferromagnetic bottom layer; and
   (c3) providing ferromagnetic middle layer, the nonmagnetic spacer layer separating the ferromagnetic bottom layer from the ferromagnetic middle layer, the ferromagnetic top layer being on the ferromagnetic middle layer.

15. The method of claim 14 wherein the ferromagnetic bottom layer is CoFe and the nonmagnetic spacer layer is Ru.

* * * * *